US010698525B2

(12) United States Patent
Ihalainen et al.

(10) Patent No.: US 10,698,525 B2
(45) Date of Patent: Jun. 30, 2020

(54) VALVE POSITIONER AND USER INTERFACE FOR VALVE POSITIONER

(71) Applicant: METSO FLOW CONTROL OY, Vantaa (FI)

(72) Inventors: Tero Ihalainen, Vantaa (FI); Juha Yli-Petäys, Kirkkonummi (FI)

(73) Assignee: METSO FLOW CONTROL OY, Vantaa (FI)

( * ) Notice: Subject to any disclaimer, the term of this patent is extended or adjusted under 35 U.S.C. 154(b) by 307 days.

(21) Appl. No.: 15/574,603

(22) PCT Filed: May 20, 2016

(86) PCT No.: PCT/FI2016/050343
§ 371 (c)(1),
(2) Date: Nov. 16, 2017

(87) PCT Pub. No.: WO2016/189195
PCT Pub. Date: Dec. 1, 2016

(65) Prior Publication Data
US 2018/0129338 A1    May 10, 2018

(30) Foreign Application Priority Data
May 22, 2015   (FI) ..................................... 20155377

(51) Int. Cl.
*G06F 3/041*   (2006.01)
*F16K 31/12*   (2006.01)
(Continued)

(52) U.S. Cl.
CPC ........ *G06F 3/0416* (2013.01); *F15B 15/2815* (2013.01); *F16K 31/12* (2013.01);
(Continued)

(58) Field of Classification Search
CPC ................ G06F 3/0416; H03K 17/962; H03K 17/9631; H03K 2217/960775;
(Continued)

(56) References Cited

U.S. PATENT DOCUMENTS 4,224,615 A * 9/1980 Penz .................... G02F 1/13338
341/33
4,807,664 A * 2/1989 Wilson ................. A01G 25/165
137/624.11
(Continued)

FOREIGN PATENT DOCUMENTS

WO        2013/184863 A1    12/2013

OTHER PUBLICATIONS

Aug. 23, 2016 International Search Report issued in International Patent Application No. PCT/FI2016/050343.
(Continued)

*Primary Examiner* — John Bastianelli
(74) *Attorney, Agent, or Firm* — Oliff PLC

(57) ABSTRACT

A smart valve positioner is provided with a local user interface with non-mechanical touch buttons and a display inside a positioner housing under a housing cover for locally operating the valve positioner. The touch buttons are user-operable by touching the touch buttons when the housing cover is open. The housing cover is arranged to make the touch buttons user-operable from outside the housing by touching the housing cover, when the housing cover is closed.

13 Claims, 4 Drawing Sheets

(51) Int. Cl.
  *H03K 17/96* (2006.01)
  *F15B 15/28* (2006.01)
  *F16K 31/122* (2006.01)
  *G02F 1/1333* (2006.01)
  *G05B 19/44* (2006.01)
  *G05D 7/06* (2006.01)
  *A01G 25/16* (2006.01)

(52) U.S. Cl.
  CPC ........ *F16K 31/122* (2013.01); *G02F 1/13338* (2013.01); *G05B 19/44* (2013.01); *G05D 7/0623* (2013.01); *H03K 17/962* (2013.01); *H03K 17/9631* (2013.01); *A01G 25/16* (2013.01); *G05B 2219/23044* (2013.01); *G05B 2219/23377* (2013.01); *G05B 2219/25257* (2013.01); *G05B 2219/25312* (2013.01); *H03K 2217/96015* (2013.01); *H03K 2217/960775* (2013.01)

(58) Field of Classification Search
  CPC .......... H03K 2217/96015; F16K 31/12; F16K 31/122; G05D 7/0623; G02F 1/13338; F15B 15/2815; A01G 25/16; G05B 2219/25312; G05B 2219/25257; G05B 2219/23377; G05B 2219/23044; G05B 19/44
  USPC .................................................... 251/129.04
  See application file for complete search history.

(56) References Cited

U.S. PATENT DOCUMENTS

| | | | |
|---|---|---|---|
| D679,259 S * | 4/2013 | Franchini | D13/162.1 |
| 8,469,054 B2 * | 6/2013 | Lang | E03C 1/055 137/607 |
| 2013/0126325 A1 | 5/2013 | Curtis et al. | |
| 2013/0189502 A1 * | 7/2013 | Takahashi | B29C 59/002 428/195.1 |
| 2013/0211604 A1 * | 8/2013 | Brundisini | A01G 25/16 700/284 |
| 2013/0327403 A1 * | 12/2013 | Jensen | F16K 31/12 137/1 |
| 2014/0018965 A1 * | 1/2014 | Pearson | G05B 15/02 700/284 |
| 2014/0076415 A1 | 3/2014 | Dunki-Jacobs et al. | |
| 2014/0218337 A1 | 8/2014 | Yamaguchi et al. | |
| 2015/0062097 A1 * | 3/2015 | Chung | H04N 5/23293 345/184 |
| 2015/0105128 A1 | 4/2015 | Huang et al. | |

OTHER PUBLICATIONS

Aug. 23, 2016 Written Opinion issued in International Patent Application No. PCT/FI2016/050343.
Jun. 5, 2017 International Preliminary Report on Patentability issued in International Patent Application No. PCT/FI2016/050343.
Nov. 1, 2017 Search Report issued in Finnish Patent Application No. 20155377.
Nov. 1, 2017 Office Action issued in Finnish Patent Application No. 20155377.

* cited by examiner

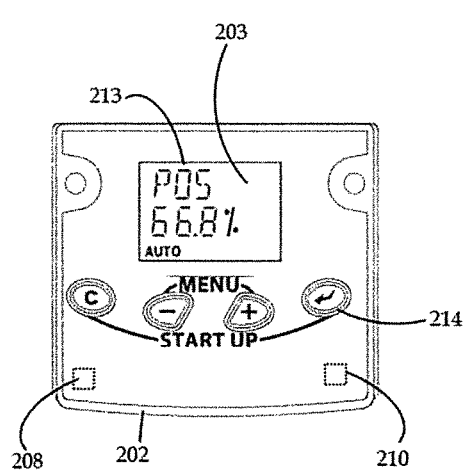
Fig. 5A
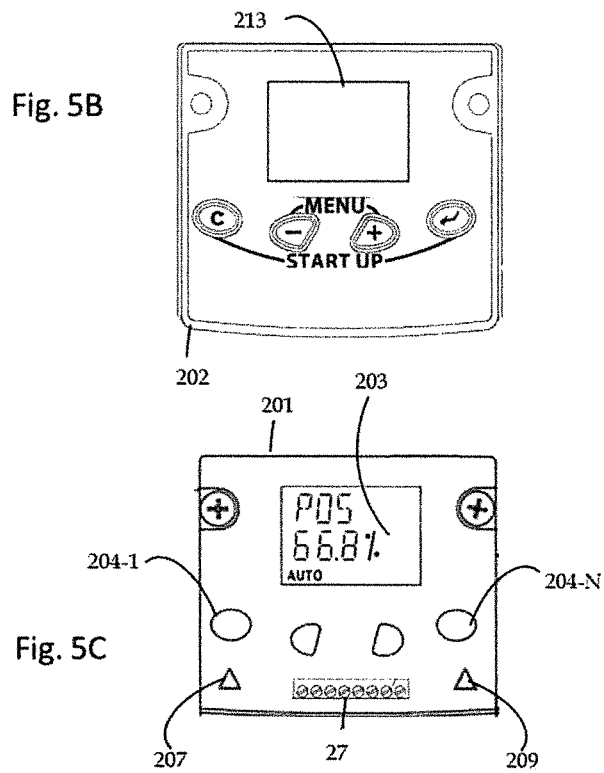
Fig. 5B
Fig. 5C
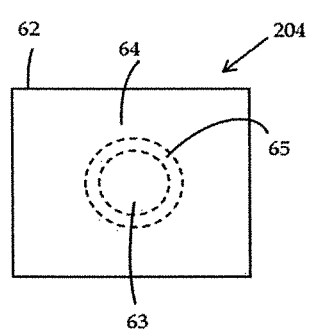
Fig. 6A
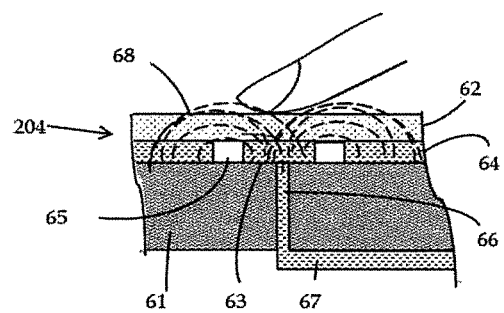
Fig. 6B
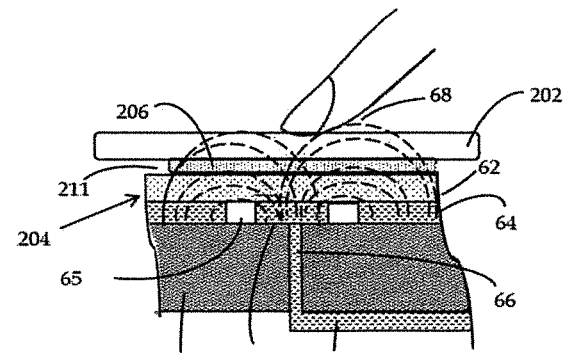
Fig. 6C

VALVE POSITIONER AND USER INTERFACE FOR VALVE POSITIONER

FIELD OF THE INVENTION

The invention relates to valve positioners, and particularly to user interfaces of smart valve positioners.

BACKGROUND OF THE INVENTION

A control valve is generally used for a continuous control of a liquid or gas flow in different pipelines and processes. In a processing industry, such as pulp and paper, oil refining, petrochemical and chemical industries, different kinds of control valves installed in a plant's pipe system control material flows in the process. A material flow may contain any fluid material, such as fluids, liquors, liquids, gases and steam. The control valve is usually connected with an actuator, which moves the closing element of the valve to a desired position between fully open and fully closed positions. The actuator may be a pneumatic cylinder-piston device, for example. The actuator, for its part, is usually controlled by a valve positioner, also called as a valve controller, which controls the position of the closing element of the control valve and thus the material flow in the process according to a control signal from the positioner. The positioner is typically controlled with an electrical control signal from a control system (such as by a single twisted pair providing a 4 to 20 mA analog signal) and includes an electric-to-pressure (I/P) conversion to provide a pneumatic control for controlling the actuator.

One of the newer devices that offer improved performance of control valves is so-called "smart" positioner or a digital valve controller. A smart positioner is a microprocessor-based electronic positioner with internal logic capability which derives benefit from digital programming to obtain improved positioning performance. An advantage of the smart positioner is that it may be programmed to use a position control algorithm to achieve better dynamic response. Further, the smart positioner may use 2-way communications protocols such Hart, Foundation Fieldbus etc. to communicate with a process control system. This type of communication can be used also to enter new control settings or configurations remotely after installing a smart positioner.

However, sometimes there is a need to read measurements, make test runs, or change positioner settings locally at the positioner. Therefore, the smart positioners are often provided with a local user interface (LUI), or a control panel, enabling personnel to, for example, monitor the device behaviour as well as configuring and commissioning the positioning during installation and normal operation. A local user interface may be designed to have, for example, a display to present data and buttons, keypads, switches or other devices to operate the positioner and to enter parameters. For example, the local user interface may comprise a small LCD display and a key-pad with a small number of buttons. Often the display may be viewable through a window in a cover of the housing to allow showing some predetermined information without opening the housing. However, in many existing LUIs it is required that user must open the housing for any kind of operation of the LUI. An example of such approach is the electro-pneumatic positioner PositionMaster EDP300 from ABB Automation Products GmbH. Many oil and gas, petrochemical and process engineering plants are operating in harsh environments which require positioners to function in severe service applications, requiring reliable components with the ability to withstand extreme temperature or ambient fluctuations and have a chemical and corrosion resistance. The positioners must also have a sufficient shock resistance against external mechanical shocks.

The opening of the housing is typically cumbersome and time consuming as the cover of the housing is often closed by screws or similar means. The opening of the housing may sometimes be difficult (e.g. due to weather conditions or plant environment) or even impossible (e.g. forbidden by Ex regulations). Every opening of the housing will be a further risk for water ingress.

One approach could be to have buttons in the outer surface of the positioner so that they could be operated without opening the housing. For example, Universal positioner SRD960 from Foxboro Eckardt GmbH has four external mechanical push buttons for local configuration and operation which penetrate the housing of the positioner. While external buttons might provide easy access, there is a new problem related to the security of the LUI usage. The ease of access may call for some protection to be implemented to prevent false input caused by dust, water drops, ice or other environmental sources. A simple keypad lock function may take care of this issue. Furthermore, when the user interface is accessible by not opening the housing, there is always a risk of un-authorized access on purpose or by human mistake. There is a need to prevent unauthorized use of local user interface especially when local user interface is available without opening the positioner cover and it is easy to access the device settings. One approach to solve this is to have PIN code protection to the devices to prevent unauthorized usage. However, it would be frustrating and time consuming to enter a PIN code (i.e. an access code) every time the local user interface is used, especially during start up configuration of the positioner. Further, there can be a high number of positioners and control valves, often hundreds of them, in a single plant, typically from several vendors, so that it would be a challenging task to manage and remember PIN codes for all positioners.

BRIEF DESCRIPTION OF THE INVENTION

An aspect of the present invention is a local user interface of a smart positioner suitable for use in field conditions.

An aspect of the invention is a smart valve positioner comprising a housing and a housing cover, the housing encompassing control circuitry connectable to a field control line, and a local user interface with one or more buttons and optionally a display inside the housing under the housing cover for locally operating the valve positioner, wherein the local user interface comprises one or more non-mechanical touch buttons enclosed inside the housing, and the housing cover is arranged to make the touch buttons user-operable from outside the housing by touching the housing cover.

In an embodiment, the housing cover can be opened, and wherein the touch buttons are user-operable by touching the touch buttons when the housing cover is open and the housing cover is arranged to make the touch buttons to be user-operable from outside the housing by touching the housing cover, when the housing cover is closed.

In an embodiment, each of the touch buttons are arranged to detect an electrical or optical influence of a user finger in the close proximity, and the housing cover is adapted to enable such electrical or optical influence through the housing cover to the touch button when the user finger touches a predetermined point on the housing cover.

In an embodiment, a thickness of the housing cover is reduced at said predetermined point in comparison with an overall thickness of the housing cover.

In an embodiment, there is an air gap or a shock-absorbing intermediate layer between the housing cover and the local user interface.

In an embodiment, the touch buttons comprise optical touch buttons, and one or more elements for controlling propagation of light is locally arranged between the housing cover and the optical touch buttons at locations of said touch.

In an embodiment, the optical touch buttons comprise reflective optical sensors having a light emitter and a light receiver, and said one or more elements for controlling propagation of light is arranged to reduce cross talk from the light emitter to the light receiver.

In an embodiment, the touch buttons comprise capacitive touch buttons with a non-conductive overlay, and wherein the housing cover is of non-conductive material, and an elastic conductive element is locally arranged are between the non-conducting housing cover and the non-conducting overlay at locations of said touch buttons.

In an embodiment, the user interface is configured to assume a first user access mode level as a default to thereby allow use of the touch buttons through the housing cover for a first set of user operations, and the user interface is configured to require a dedicated access code for entering a further user access mode level to thereby allow use of the touch buttons through the housing cover for one or more further sets of user operations.

In an embodiment, the local user interface panel with the housing cover closed is configured to assume a first user access mode level as a default to thereby allow use of the non-touch buttons through the housing cover for a first set of user operations, and the local user interface is responsive to an opening of the housing of the valve positioner to assume a further user access mode level to thereby allow use of the non-touch buttons through the closed housing cover for one or more further sets of user operations.

In an embodiment, the local user interface with the housing cover closed is configured to assume a first user access mode level as a default to thereby allow use of the touch buttons through the housing cover a first set of user operations, and the local user interface with the housing cover opened is configured to assume a further access user access mode level to thereby allow use of the touch buttons directly on the local user interface for one or more further sets of user operations.

In an embodiment, said first set of user operations include reading operations, and said one or more further sets of user operations include reading operations and procedures for locally controlling parameters and operation of the smart valve positioner.

In an embodiment, the local user interface is provided with electrical, optical or mechanical detector means for detecting whether the housing or the housing cover is opened or closed.

In an embodiment, the housing cover comprises at least one magnetic element and the local user interface panel is provided with a sensor arranged detect the presence of the magnetic element, the detector preferably comprising a Hall sensor.

In an embodiment, the user interface is configured to assume the further user access mode level automatically for a predetermined period of time upon connecting a power to the valve positioner, and the first user access mode level is resumed after expiry of the predetermined period of time from the connection of the power.

A further aspect of the invention is a valve assembly comprising a valve, an actuator, and a valve positioner according any one or any of combination of its embodiments.

A still further aspect of the invention is use of a smart valve positioner according any one or any of combination of its embodiments in a process industry.

BRIEF DESCRIPTION OF THE DRAWINGS

In the following, the invention will be described by means of exemplary embodiments with reference to the attached drawings, in which

FIG. 5A illustrates a top view of an exemplary positioner with a housing cover placed on the local user interface panel (housing closed);

FIG. 5B illustrates a top view of the exemplary housing cover when removed from the local user interface panel (housing opened);

FIG. 5C illustrates a top view of an exemplary local user interface panel when the housing cover is removed (housing opened);

FIGS. 6A and 6B show a top view and a cross-sectional view, respectively of an exemplary capacitive touch button when the housing cover is open;

FIG. 6C shows a cross-sectional view of the exemplary capacitive touch button when the housing cover is closed;

EXAMPLE EMBODIMENTS OF THE INVENTION

The invention relates to valve positioners, and particularly to user interfaces of smart valve positioners.

Figure 1:
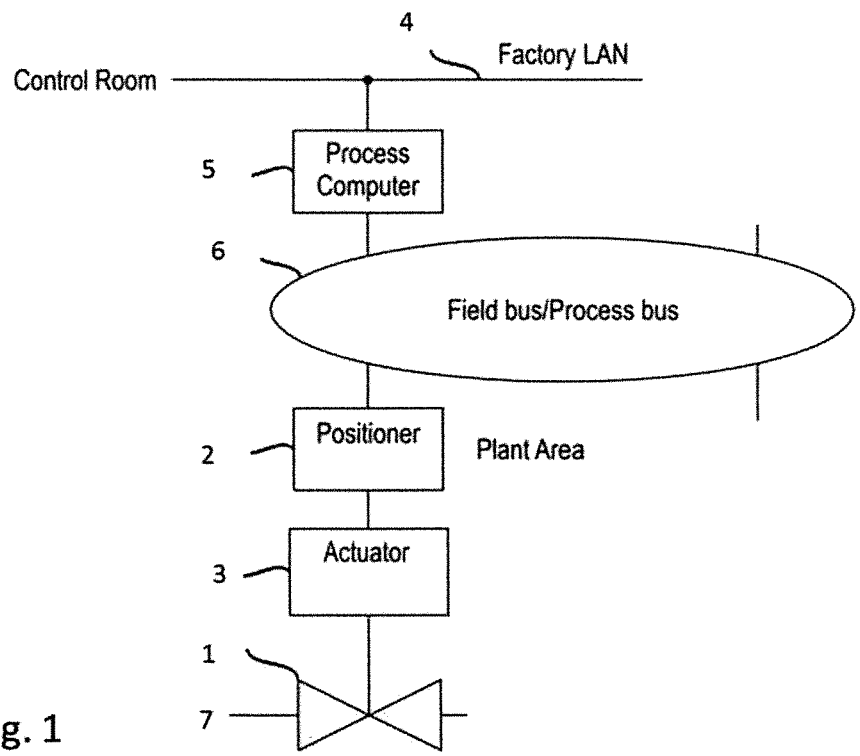
FIG. 1 illustrates a schematic block diagram of an exemplary process automation system.
Figure 2:
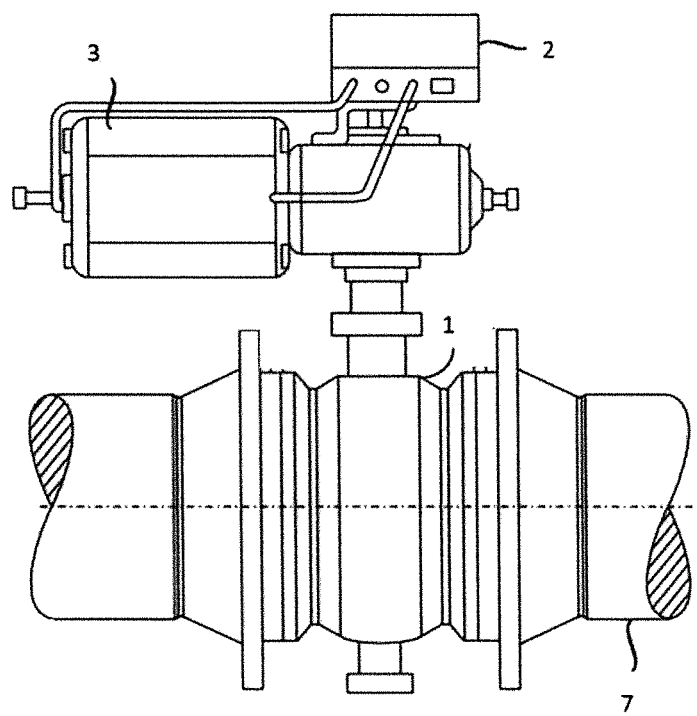
FIG. 2 illustrates an exemplary arrangement wherein a pneumatic actuator operates the process valve under control of the valve positioner.

FIG. 1 shows a schematic block diaphragm of an exemplary process automation system wherein the principles of the invention may be applied in a valve positioner. The control system block 5 generally represents any and all control room computer(s)/programs and process control computer(s)/programs as well as databases, which may be interconnected by a factory LAN 4, in the automation system. There are various architectures for a control system. For example, the control system may be a Direct Digital Control (DDC) system or Distributed Control System (DCS), both well known in the art. It should be appreciated that the type or architecture of the automation system is not relevant to the present invention In the example of FIG. 1, a control valve assembly comprising a process valve 1 and a positioner 2 and an actuator 3 may be connected to a process to control the flow of a substance in process pipeline 7. Material flows of a process or process pipeline may be controlled in a processing industry, such as pulp and paper, oil refining, petrochemical and chemical industries. The material flow may contain any fluid material, such as fluids, liquors, liquids, gases and steam. Although only one controlled process valve assembly is shown in FIG. 1, an automation system may, however, include any number of field devices, such as control valve assemblies, often hundreds of them. FIG. 2 illustrates a mechanical structure of an exemplary control valve assembly wherein a pneumatic actuator 3 operates the process valve 1 under control of the valve positioner 2. An example of a process valve 1 is Neles® RotaryGlobe control valve from Metso Corp. An example of a valve positioner 2 wherein embodiments of the invention may be applied is Neles® ND9000 intelligent valve controller from Metso Corp. An example of an actuator 3 is Quadra-Power X series pneumatic actuator from Metso Corp. However, it is to be understood that, beyond a local user interface of the positioner 2, the type and implementation of the control valve assembly is not relevant to the present invention. As used herein, "control valve" means also an on/off type shutoff valve.

There are various alternative ways to arrange the interconnection between the control system and field devices, such as control valves, in a plant area. In FIG. 1, the field/process bus 6 generally represents any such interconnection. Traditionally, field devices have been connected to the control system by two-wire twisted pair loops, each device being connected to the control system by a single twisted pair providing a 4 to 20 mA analog input signal. More recently, new solutions, such as Highway Addressable Remote Transducer (HART) protocol, that allow the transmission of digital data together with the conventional 4 to 20 mA analog signal in the twisted pair loop have been used in the control systems. The HART protocol is described in greater detail for example in the publication HART Field Communication Protocol: An Introduction for Users and Manufacturers, HART Communication Foundation, 1995. The HART protocol has also been developed into an industrial standard. Examples of other fieldbuses include Foundation Fieldbus and Profibus PA. However, it is to be understood that the type or implementation of the field/process bus 3 is not relevant to the present invention. The field/process bus 3 may be based on any one of the alternatives described above, or on any combination of the same, or on any other implementation.

The operation of an intelligent (smart) valve positioner, such as the positioner 2, may be based on a microcontroller, such as a microprocessor (μP), which controls the position of the valve 1 on the basis of control information obtained from the field connection line or fieldbus 6. The positioner is preferably provided with valve position measurement, in addition to which it may be possible to measure many other variables, such as supply pressure for pressurized air, pressure difference over actuator piston or temperature, which may be necessary in the self-diagnostics of the valve or which the valve controller transmits as such or as processed diagnostic information to the control room computer, process controller, condition monitoring computer or a similar higher-level unit of the automation system via a field bus.

Figure 3:
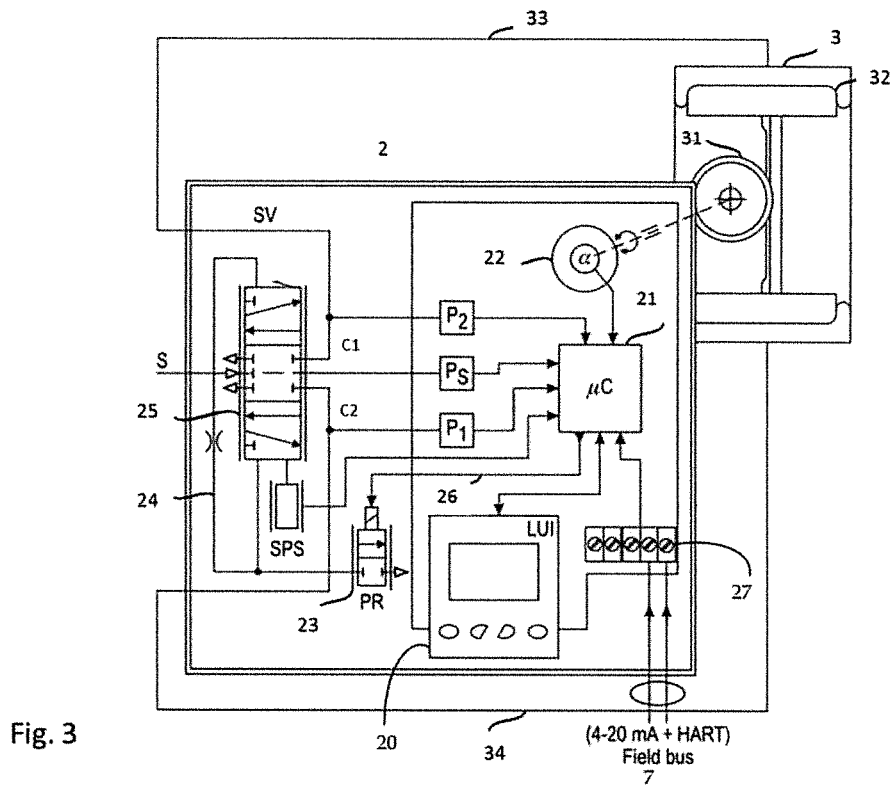
FIG. 3 shows a schematic block diagram of an exemplary intelligent valve controller wherein a fluid valve assembly according to embodiments of the invention may be applied.

An example block diagram of microcontroller-based smart valve positioner, such as positioner 2, is illustrated in FIG. 3. The exemplary positioner 2 may include a microcontroller unit 21 having an electrical control output 26, and a pneumatic unit 23, 25 that takes in the electrical control signal 26 and converts it to a corresponding fluid pressure output P1,P2 at actuator ports C1, C2 connected to an actuator 3. The pneumatic unit may comprise a prestage 23 and an output stage 25. The prestage 23 may perform an electric-to-pressure (I/P) conversion of the electrical control signal 26 into a small pilot pneumatic control signal 24 which is sufficient to control the output stage 25. The supply port S of the output stage 25 may be connected to a supply air pressure S. The output stage 25 may amplify the small pneumatic pilot signal into a larger pneumatic pressure output signals 33 34 at the actuator ports C1,C2 to move a diaphragm piston 32 of the actuator 3. A position sensor 22 may be provided to measure the position of the actuator or valve for the microcontroller 21. For example, the sensor 22 may be arranged to measure the rotation of a feedback shaft 31 of an actuator. A microcontroller unit 21 controls the valve position according to a control algorithm run in the microcontroller 21. To that end, the microcontroller 21 may receive an input signal (a set point) over a process/fieldbus 7, such as 4-20 mA pair and HART, which is connected to a connector 27. The positioner 2 may be powered from a 4-20 mA loop or fieldbus. The microcontroller 21 may also read one or more of a supply pressure sensor Ps, a first actuator pressure sensor P1, a second actuator pressure sensor P2, and an output stage position sensor SPS. The positioner 2 may further contain a Local User Interface (LUI) 20 connected to the microcontroller 21. The microcontroller 21 may display any information on a display of the local user interface 20, and receive commands and parameters from a keypad or buttons of the local user interface 20. It should be appreciated that the illustrated valve positioner is merely an example and the type or implementation of a valve positioner 2, beyond a local user interface, is not relevant to the present invention.

The local User Interface (LUI) functions may include, for example, one or more of the following functions: Local control of the valve; Monitoring of valve position, target position, input signal, temperature, supply and actuator pressure difference; Guided-startup function; LUI 20 may be locked remotely to prevent unauthorised access; Calibration, e.g. an automatic or manual linearization; 1-point calibration; Control configuration: aggressive, fast, optimum, stable, maximum stability; HART/Fieldbus version configuration; Configuration of the control valve; Rotation: valve rotation clockwise or counter-clockwise to close; Dead Angle; Low cut-off, cut-off safety range; Positioner fail action, open/close; Signal direction: Direct/reverse acting; Actuator type, double/single acting; Valve type, rotary/linear; Language selection.

An aspect of the invention is a local user interface (LUI) of a smart positioner which is easier to access in field conditions while having sufficient access control to maintain security and integrity of the valve control.

Figure 4:
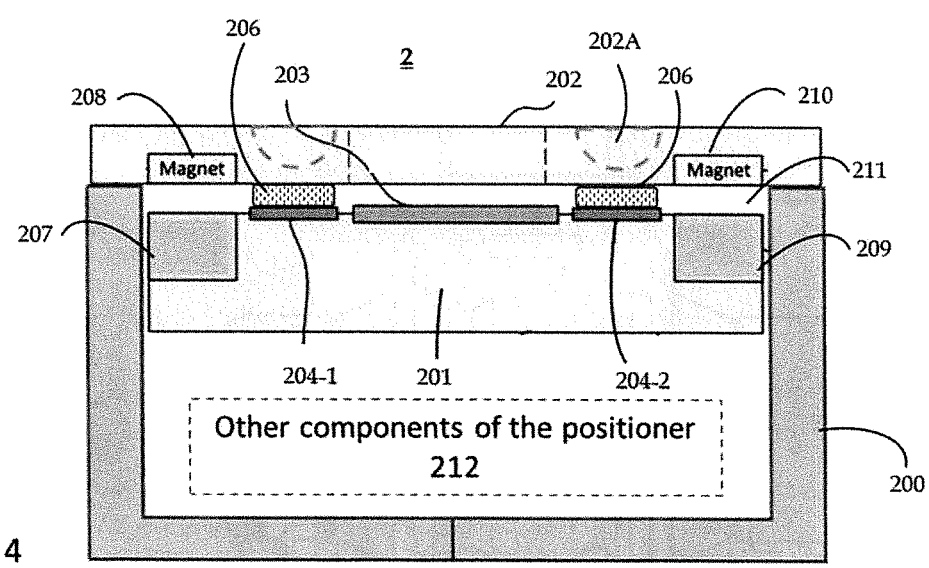
FIG. 4 illustrates an exemplary local user interface of a smart valve positioner comprising a local user interface panel within housing and a housing cover allowing use of touch buttons through the cover.

An aspect of the invention is a smart valve positioner 2 comprising a housing 200 and a housing cover 202, such as an exemplary positioner 2 in FIG. 4. The housing 200 may encompass the control circuitry, such as circuitry 212 (e.g. on a system printed circuit board) connectable to a field control line, and a local user interface unit (e.g. on a LUI printed circuit board), such as the panel 201, with one or more touch buttons 204-1 . . . 204-N and a display 203 for monitoring and configuring the positioner during installation and normal operation the valve positioner 2. The local user interface panel 201 is enclosed inside the housing 200 by the housing cover, such as a cover 202, when the housing 200 is closed. The housing cover 202 may be transparent or comprise a transparent window 213 so that the display 203 may be viewable through the housing cover 202 without opening the housing. FIG. 5A illustrates a top view of an exemplary positioner 2 with the housing cover 202 placed on top of the local user interface panel 201 (housing closed), FIG. 5B illustrates a top view of the exemplary housing cover 202 when removed from the top of the local user interface panel 201 (housing opened), and FIG. 5C illustrates a top view of an exemplary local user interface panel 201 when the housing cover 202 is removed (housing opened).

According to an aspect of the invention the local user interface panel 201 may comprise touch buttons, such as touch buttons 204-1 . . . 204-N, and the housing cover 202 may be arranged to make the touch buttons of the local user interface panel 201 user-operable by touching the outer surface of the closed housing cover 202 without contacting the actual touch buttons 204-1 . . . 204-N under the housing cover 202. The outer surface of the housing cover 202 may be provided with appropriate markings to assist the use of the buttons 204-1 . . . 204-N, as illustrated in FIGS. 5A and 5B. The markings may be printed or otherwise produced to the housing cover 202. Embodiments of the invention employ the touch button technology in a special manner so that user can access the local user interface without opening the positioner housing. In embodiments, the touch buttons 204-1 . . . 204-N may be arranged to detect an electrical or optical influence of a user finger in the close proximity, and the housing cover 202 may adapted to enable such electrical or optical influence through the housing cover 202 to the touch button when the user finger touches a predetermined point on the outer surface of the housing cover 202. In embodiments, the thickness of the housing cover 202 may be reduced at locations of the buttons in comparison with the overall thickness of the housing cover, in order to facilitate the touch detection. For example, there may be recession 202A on the outer surface of the housing cover 202 at location of each button as illustrated by a broken line in FIG. 4. For example, the housing cover 202 may be made of glass or thermoplastic polymer, such as polycarbonate. The cover material may be electrical insulator if capacitive touch button technology is utilized for buttons 204-1 . . . 204-N. In case of optical touch button technology, the electrical conductivity of the cover 202 is not relevant. In exemplary embodiments, capacitive or optical, i.e. non-mechanical, buttons may be used for the touch buttons of the local user interface panel One requirement for a valve positioner may be a sufficient shock resistance against external mechanical shocks. In an embodiment, there may an air gap or space, such as the gap 211 illustrated in FIG. 4, between the inner surface of the housing cover 202 and the outer surface of the local user interface panel 201. Alternatively, there may be one or more shock-absorbing intermediate layers between the inner surface of the housing cover 202 and the outer surface of the local user interface panel 201, instead of the gap 211. Thereby, the cover 202 may not directly mechanically contact the local user interface panel, and a bending or other deformation of the cover due to external factors, such as external shocks, may be allowed in some degree without exerting excessive forces to the local user interface panel 201 and causing damage to it.

An air gap or a shock absorbing layer 211 may reduce the detectable electrical or optical influence through the housing cover 202 to the touch button when the user finger touches a predetermined point on the outer surface of the housing cover 202. In an embodiment, in order to compensate such effect, a suitable elastic contact pad, such as a contact gel pads 206, may be locally arranged between each of the touch buttons 204 and 205 and the housing cover 202. In an embodiment, such contact pads 206 may be attached to corresponding points on the internal surface of the housing cover 202. Examples of materials and structures for the contact pads include conductive foam pads cut to dimension, conductive EMC gaskets and other electrically conductive flexible materials, such as a compressed spring. These conductive pads may be glued or attached permanently by other means to housing cover or the LUI cover. Such pads may also be produced by injection molding of conductive flexible material on the locations of buttons to device cover or LUI cover. In embodiments using optical touch buttons, the air gap 211 may not affect the touch detection through the housing cover 202 and no contact pads may be needed. However, in order to assure a proper optical path between the optical touch button and the housing cover 202, contact pad or element 206 with suitable optical properties may be used.

Figure 7:
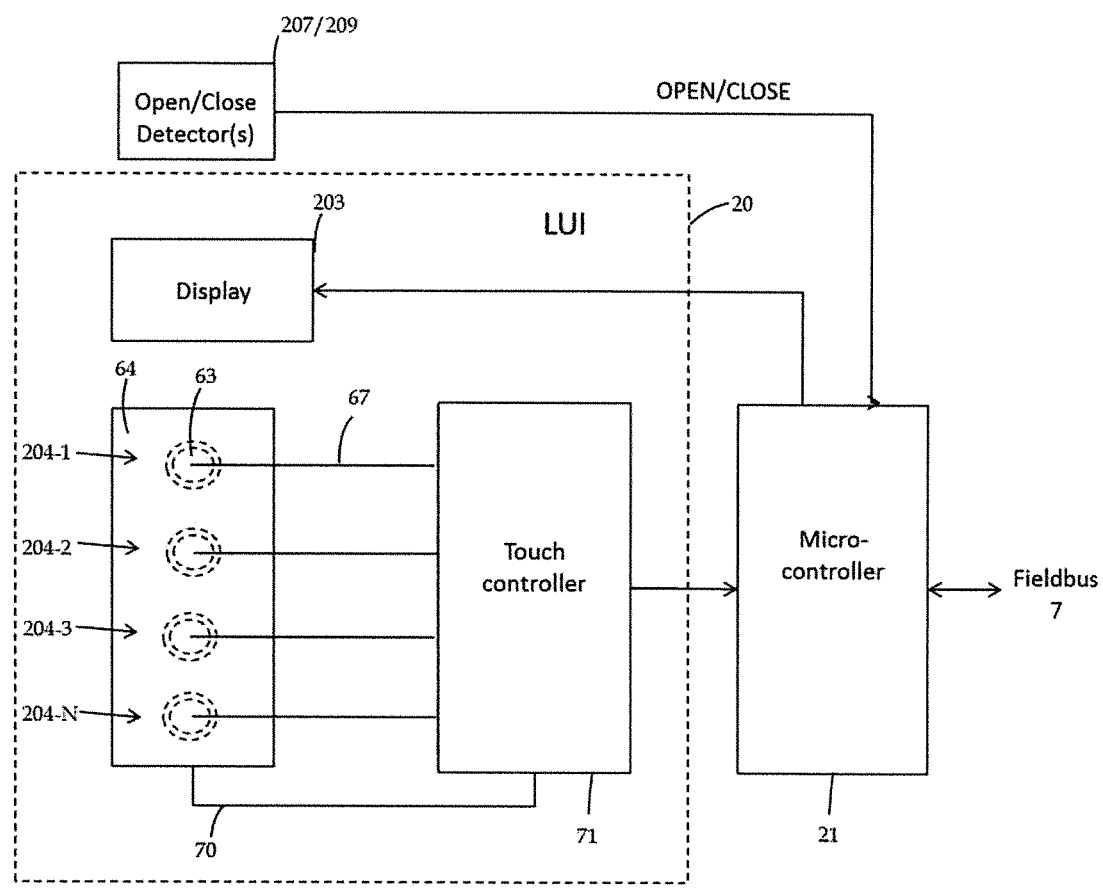
FIG. 7 shows a schematic block diagram for an exemplary local user interface connected to a microcontroller.

In embodiments of the invention, the buttons of the local user interface panel 201 may be capacitive touch buttons. The capacitive-touch mechanism is schematically illustrated by a design example in FIGS. 6A and 6B. FIGS. 6A and 6B show a top view and a cross-sectional view, respectively of an exemplary capacitive touch button 204 implemented on a printed circuit board (PCB) 61. The exemplary capacitive touch button 204 may comprises and a nonconductive overlay material 62, a conductive sensor pad or trace 63 surrounded by a grounded conductive plane or trace 64 on the to surface of the PCB 61, and an insulated (non-conductive) overlay 62 placed directly over them to protect them from the environment and prevent direct finger contact. The overlay material 62 is placed over the sensor pad to protect it from the environment and prevent direct finger contact. The sensor pad and the grounded hatch may be separated by an intermediate uniform gap 65. The ground plane 64 also helps to shield the capacitive button structure from possible other electronics. The sensor pad 63, the grounded plane 64 and the gap 65 can be made with conventional printed circuit techniques to be part of the PCB 61. In the example of FIG. 6B, a two-layer printed circuit board is used with sensor pads 63 and a ground plane 64 on the top, and a connection wiring or traces 67 and possible associated electrical components (not shown) on the bottom. Examples of such electrical components include a capacitance-measuring circuitry, such a touch controller and associated parts that convert a sensor capacitance into digital format. A conductor via or through hole 66 in the PCB 61 may connect each sensor pad 63 to the respective trace 67 on the bottom side of the board 61, as illustrated in FIG. 6B. In the example illustrated in FIG. 6A, there is a round sensor pad 63 and an annular gap 65, but a sensor pad or trace may assume any shapes. In FIGS. 6A and 6B only one button 204 is illustrated but there may be any number of buttons in the same panel or PCB. For example, a LUI 20 with N touch buttons 204-1, 204-2, 204-3, . . . , 204-N on the same panel is schematically illustrated in FIG. 7. The exact implementation of the touch button is not relevant with respect to the present invention.

As illustrated in FIGS. 6A and 6B, a capacitive touch button 204 is essentially a capacitor formed from two adjacent traces 63 and 64, and the laws of physics determine how much capacitance exists between them. Dashed lines 68 represent an electric field between the sense pad 63 and the grounded plane 64. If a finger is brought in close proximity to the capacitive button 204, the finger disrupts the electric field 68, which sees the finger as a conductive foreign object, thus changing the capacitance. Place a finger on the overlay 62, and the capacitance increases. Remove the finger, and the capacitance decreases. By measuring the capacitance, the presence or absence of a finger can be determined.

Several commercial solutions for capacitive touch sensing are available, for example in form of dedicated function integrated circuits, and in form of software libraries for microcontrollers having built-in sensor interface electronics like, for example, analog to digital converters and analog comparators. The exact implementation of the touch sensor signal processing is not relevant with respect to the present invention.

FIG. 7 shows a schematic block diagram for an exemplary local user interface 20 connected to a microcontroller 21. The LUI 20 may contain a display 203 controlled by the microcontroller 203, and a capacitive touch pad with N capacitive touch buttons 204-1, 204-2, 204-3, . . . , 204-N. Each capacitive touch button 204-1, 204-2, 204-3, . . . , 204-N may be implemented with a structure shown in FIG. 6B, resulting in a N sensor pads 63 surrounded by a common ground plate 64. Each sensor pad 63 may be connected with a respective wire 67 to a sensor input of a touch controller 71. An example of a commercial circuit suitable for the touch controller 71 is LDS6100/6120 family of capacitance touch controllers from Integrated Device Technology Inc. When configured for capacitive sensing, the touch inputs are directed to the touch controller 71 which senses changes in the external sensor pads 63. When a change in capacitance occurs above a user defined threshold, a touch event is recognized and the host processor 21 is notified. Capacitive sensing may be accomplished using a sigma-delta converter capable of converting a sensor input signal into a digital output that may be compared against a touch/no-touch threshold value to determine if a touch has occurred. The button status and digitized capacitance values may be stored in on-chip registers available to the host processor 21.

As discussed above, FIG. 6B shows a cross-sectional view of an exemplary capacitive touch button 204 as normally used, i.e. the overlay 62 forms the touch surface. In embodiments of the invention this is the situation wherein the housing cover is opened and the touch button 204 is exposed to be operated directly by touching the overlay 62. FIG. 6C shows a cross-sectional view of the exemplary capacitive touch button 204 when the housing cover 202 is closed, i.e. placed on top of the touch button 204. In FIGS. 6A, 6B and 6C same reference symbols represent the same or equivalent structures or functions. The material of the housing cover is an electrical insulator (non-conductive). Conductive material cannot be used in the housing cover 202 because it interferes with the electric field pattern 68. One requirement for a valve positioner may be a sufficient shock resistance against external mechanical shocks. As discussed above, there may an air gap or space 211 between the housing cover 202 and the overlay 62 of the touch button 204 in order to improve the resistance to external shocks, such as the gap 211 illustrated in FIG. 4, between the inner surface of the housing cover 202 and the outer surface of the local user interface panel 201. Because air has a relatively low dielectric constant which reduces the sensitivity, any air gap between the housing cover 202 and overlay 62 is preferably eliminated at least at the location of the sensor pad 63. To that end, as has been discusses above, a suitable elastic contact pad 206 may be locally arranged between the touch buttons 204 and the housing cover 202 to couple the electric field 68 from the overlay 62 to the housing cover 202. The housing cover 202 further reduces the electric field 68 reaching the top surface of the housing cover. However, the inventors have observed that, in spite of these additional layers and materials which reduce the sensitivity of the underlying touch button 204, the capacitance measurement can still be adjusted to detect a finger touching the top surface of the housing cover 202. Thus, the local user interface 20 located under the housing cover can be operated also when the housing cover is closed. In embodiments, when a thick cover is required to obtain sufficient mechanical robustness, the thickness of the housing cover 202 may be reduced at locations of the buttons in comparison with the overall thickness of the housing cover, in order to facilitate the touch detection, as illustrated in FIG. 4. The same measurement circuitry, such as that illustrated in FIG. 7, can be used for detecting a touch event with the cover closed and open.

Figure 8A:
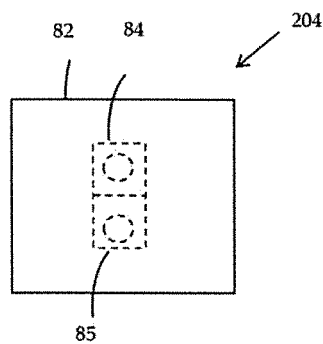
FIGS. 8A and 8B show a top view and a cross-sectional view, respectively of an exemplary optical touch button when the housing cover is open.
Figure 8B:
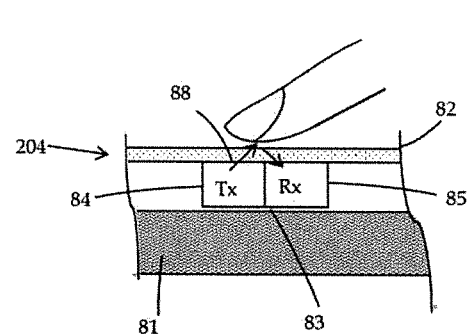

In embodiments of the invention, the buttons of the local user interface panel 201 may be optical touch buttons. A reflective optical touch sensing mechanism is schematically illustrated by an example in FIGS. 8A, 8B and 8C. FIGS. 8A and 8B show a top view and a cross-sectional view, respectively of an exemplary optical touch button 204 implemented on a printed circuit board (PCB) 81. The exemplary optical touch button 204 may comprise an optical sensor 82 having a light emitter or transmitter (Tx) 84 and a light detector or receiver (Rx) 85, and a transparent overlay material 82 placed on the top of the sensor to form a touch surface with a window. The overlay 82 is typically very thin, or sometimes omitted. The optical sensor 83 may operate with infrared light, for example. The emitter 84 of optical sensor 83 may be implemented by a LED, and the detector 85 may be implemented by a photodiode, for example. Alternatively, phototransistors or other types of light emitter and light detector devices may be used. Examples of commercial optical sensors include OPB744 from OPTEK Technology Inc and HSDL—9100 from Avago Technologies. The emitter may emit IR light pulses 88. This light travels out in the field of view and will either hit an object or continue. No light will be reflected when no object (such as a finger) is detected. On the other hand, if an object is present on the propagation path of light 88, IR light will reflected from the object and detected by the detector 84. The output of the detector 84 may itself be a touch status signal that indicates a touch event if the reflected light level exceeds a predetermined threshold. Alternatively, the detector 84 may have an associated circuitry (such as a comparator) that provides the touch status signal based on the output signal of the detector 84. Still alternatively, the micro controller 21 of the positioner may make a decision on a touch event based on the output signal level of the detector 84, for example. The touch status signal from detector 84 or the associated circuitry may be applied to the micro controller 21 of the positioner. The associated circuitry may be similar to the touch controller 71 illustrated for a capacitive touch button in FIG. 7. Also otherwise the circuit arrangement may be similar to that illustrated in FIG. 7, except that optical touch buttons and optical touch controller are employed. Further, in FIGS. 8A and 8B only one button 204 is illustrated but there may be any number of buttons in the same panel or PCB. For example, the N touch buttons 204-1, 204-2, 204-3, . . . , 204-N illustrated in FIG. 7 may be implemented with N optical touch buttons. However, the exact implementation of the touch button or detection of the touch event is not relevant with respect to the present invention.

Figure 8C:
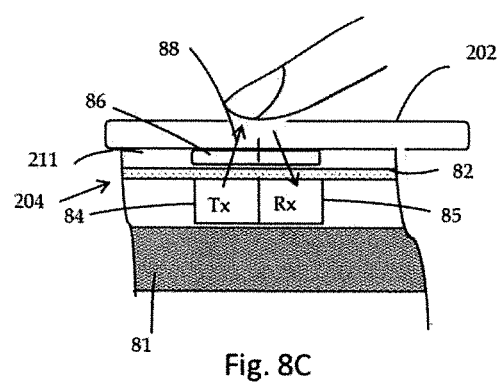
FIG. 8C shows a cross-sectional view of the exemplary optical touch button when the housing cover is closed.

As discussed above, FIG. 8B shows a cross-sectional view of an exemplary optical touch button 204 as normally used, i.e. the overlay 82 forms the touch surface. In embodiments of the invention this is the situation wherein the housing cover is opened and the touch button 204 is exposed to be operated directly by touching the overlay 82. FIG. 8C shows a cross-sectional view of the exemplary capacitive touch button 204 when the housing cover 202 is closed, i.e. placed on top of the touch button 204. In FIGS. 8A, 8B and 8C same reference symbols represent the same or equivalent structures or functions. The material of the housing cover can be anything that allows providing an optical path for the light to and from the optical sensor 83. The housing cover 202 further reduces the level of light reflected from the object touching the top surface of the housing cover. If required, the longer distance to the object may be compensated by increasing the emission power of the emitter 83 and/or the sensitivity (threshold) of the detector 84. Thus, a finger touching the top surface of the housing cover 202 can be detected, and thereby the local user interface 20 located under the housing cover can be operated also when the housing cover is closed. In embodiments, when a thick cover is required to obtain sufficient mechanical robustness, the thickness of the housing cover 202 may be reduced at locations of the buttons in comparison with the overall thickness of the housing cover, in order to facilitate the touch detection, as illustrated in FIG. 4. The same measurement circuitry, such as circuitry similar to that illustrated in FIG. 7, can be used for detecting a touch event with the cover closed and open.

One requirement for a valve positioner may be a sufficient shock resistance against external mechanical shocks. As discussed above, there may be an air gap or space 211 between the housing cover 202 and the overlay 82 of the touch button 204 in order to improve the resistance to external shocks. The air gap does not interfere with the optical signal but the longer distance and the bottom of the housing cover may increase cross-talk from the emitter 83 to the detector 84. Therefore, an element reducing the cross talk may be provided between the housing cover 202 and the optical touch button 204. Such element may be any structure separating the paths of the emitted light and the reflected light in the air gap. The element may be a simple separating wall or baffle, for example. In an embodiment two separated light guides may be used.

The local user interface according to embodiments of the invention improves both the reliability and the usability of the user interface. As the touch buttons of the local user interface 20 located inside the positioner housing can be operated by touching the housing cover, the local user interface is totally sealed from the environment and protected from external forces. The touch buttons do not penetrate the housing cover of the positioner. There are no mechanical forces exerted directly on the buttons. The touch buttons do not wear out. All external stress is received by the housing cover. This can make the local interface of the positioner more reliable. Mechanical switches may wear out and also must penetrate the positioner housing. A touch panel provided on the outer surface of the positioner would be exposed to the environment and the external mechanical forces. On the other hand, a normal touch panel which is under a cover and can be operated only with cover open is more cumbersome to use. However, the manufacturing costs of touch buttons according to embodiments of invention are lower in comparison with mechanical switches. However, the user interface being accessible without opening the positioner housing, there is always a risk of un-authorized access on purpose or by human mistake. Further, the ease of access to operate a local user interface 20 will call for some protection to be implemented to prevent false input caused by dust, water drops, ice or other environmental sources, or by human errors.

An aspect of the invention is a protection against unauthorized access and simultaneously against false inputs due to human errors or environmental reasons in such a positioner in which the local user interface can be operated without opening the positioner housing.

It should be appreciated that principles of this aspect of the invention are applicable not only to the local user interface according to embodiments of the first aspect of the invention but also to other types of local user interfaces. With respect to the second aspect of the invention, the implementation or design of the local user interface is not relevant beyond that the access rights are different depending on whether the housing of the positioner is opened or closed. In this context, the opening of housing refers to any type of accessing connectors or other components within the housing of the positioner.

According to an aspect of the invention the valve positioner is configured to change an operation mode of the local user interface, when the housing or housing cover is opened. The change in the operation mode may appear to a user as different menus, different prompts, different control views, different operations, etc. which are not presented and/or accessible when the housing or housing cover is closed.

According to an aspect of the invention the local user interface may have a first user access mode level allowing use of the buttons of the local user interface for a first set of user operations and one or more further user access mode levels allowing use of the buttons of the local user interface 20 for one or more further sets of user operations. In other words, different levels of access rights may be defined for a LUI operation. The local user interface may assume a specific level of access rights when predetermined conditions are fulfilled.

In an embodiment the local user interface may assume different levels of access rights depending on whether the housing or enclosure of the positioner is open or closed, e.g. whether a cover of the housing is open or closed. In other words, an automatic access right control may be implemented by detecting the open/close state the housing. This requires that the state of the housing is known. The risk of altering valve package or process critical parameters by mistake is highly reduced. Installation related parameter access may be granted only when the valve positioner is in an installation phase (i.e. the housing is open, e.g. due to the cover being open). A separate keypad lock function is not necessarily required to prevent false input caused by dust, water drops, ice or other environmental sources, because the altering of parameters may be prevented when the housing, e.g. a housing cover, is closed. However, a keypad lock function may still be implemented as a redundant safety feature.

In an embodiment the positioner 2 may be provided with electrical, optical or mechanical detector means for detecting whether the housing, is opened or closed. In an embodiment the detector means are arranged to detect whether a housing cover is open or closed. In an embodiment the removable part of the positioner, such as the housing cover 202, may comprise at least one magnetic element and the other part of the positioner, such as the local user interface panel 201, the housing 200 or any other component within the housing, may be provided with at least one sensor or detector arranged detect the presence or proximity of the magnetic element. The output of these devices switches low (turns on) when a magnetic field from the magnetic element exceeds a threshold (the cover is closed). When the magnetic element is moved away (the cover is opened), magnetic field is reduced below a release threshold and the device output goes high (turns off). Examples of suitable detectors or sensors include a Hall sensor and a Reed switch. An example of a commercial Hall sensor is A1210 from Allegro MicroSystems, LLC.

In an exemplary embodiment illustrated in FIG. 4 the cover state detection can be achieved by having a permanent magnet 208 on the housing cover 202 and a detector, such as Hall sensor or Reed switch, 207 on the local user interface panel 201 (e.g. on a LUI printed circuit board) or on a system printed circuit board 212, for example, to detect the presence of the magnet 208. If necessary, one or more additional pairs of a small permanent magnet 210 and a detector or sensor 209 may be used for robustness or to improve the immunity against strong external magnetic fields or magnetic jamming.

Examples of optical and mechanical detectors for detecting the opening state of the housing include an optical switch (e.g. a phototransistor) or a mechanical micro switch, for example. An optical or mechanical switch may be used especially if immunity against strong external magnetic fields or magnetic jamming is required. An optical switch pair or mechanical switch pair may also be duplicated (in a similar manner as the magnet/Hall-switch pairs in FIG. 4).

In an embodiment, the detector 207/209 for detecting the opening state of the housing, e.g. the state of the cover 202, may provide the state information in form of a two-state digital signal (OPEN/CLOSE) which makes it robust against electrical noise.

In an embodiment the opening state information may be provided from the detector to a control unit or a microcontroller, such as from the detector(s) 207/209 to the microcontroller 21 as illustrated in FIG. 7. The control unit or microcontroller 21 may utilize the opening state information in the system level to access control or to define access profile to the local user interface 20.

In an embodiment, when the housing of the positioner is closed, the local user interface 20 may be configured to assume the first user access mode level as a default to thereby allow use of the buttons of the LUI 20 for the first set of user operations. In an exemplary embodiment, the touch buttons 204-1 . . . 204-N may be used through the housing cover 202. When the housing is open, the local user interface 20 may be configured to assume a further access user access mode level to thereby allow use of the buttons of the LUI 2020 for one or more further sets of user operations. In an exemplary embodiment, the touch buttons 204-1 . . . 204-N may be used directly on the local user interface panel 201.

In an embodiment, when the housing of the positioner is closed, the local user interface 20 may be configured to assume the first user access mode level as a default to thereby allow use of the buttons of the LUI 20 for reading operations. In an exemplary embodiment, the touch buttons 204-1 . . . 204-N may be used through the housing cover 202 for reading operations. When the housing is open, the local user interface 20 may be configured to assume a further access user access mode level to thereby allow use of the buttons of the LUI 20 for reading operations and procedures for locally configuring parameters and controlling operation of the smart valve positioner. In an exemplary embodiment, the touch buttons 204-1 . . . 204-N may be used directly on the local user interface panel 201 for reading operations and procedures for locally configuring parameters and controlling operation of the smart valve positioner. Examples of configuration parameters may include valve type, actuator type, positioner fail action, valve rotation direction, and valve dead angle.

In an embodiment, when the housing of the valve positioner 2 is closed, the local user interface 20 is configured to require a dedicated access code for at least one further user access mode levels to thereby allow use of the buttons of the LUI 20 one or more further sets of user operations, e.g. for reading operations and for locally controlling parameters and operation of the smart valve positioner. In an exemplary embodiment, the touch buttons 204-1 . . . 204-N may be used through the closed housing cover 202 for one or more of the further sets of user operations, e.g. for reading operations and for locally controlling parameters and operation of the smart valve positioner.

An example of user access rights based on the housing opening state is illustrated below.

State 1: Housing closed
User may browse through parameter set A
User may access diagnostics graphs
User may not change parameters
User may not start tests
State 2: Housing open
User may browse through parameter set A
User may browse through parameter set B
User may access diagnostics graphs
User may change parameters
User may start tests In an embodiment, an alarm may be initiated when an opening of the positioner housing is detected. In an embodiment, a log may be maintained on the openings of the housing. In an embodiment, all actions made with the housing open may be recorded.

As noted above, different levels of access rights may be defined for a LUI operation. The local user interface may assume a specific level of access rights when predetermined conditions are fulfilled. In embodiments, the predetermined conditions for assuming different levels of access rights may comprise different access codes, i.e. PIN codes, for different levels of access rights to the local user interface. This may alleviate the problem normally related to the use PIN code protection: it is very frustrating and cumbersome to enter PIN code every time a local user interface is used. This is especially true for a (OEM) valve vendor at setup phase during configuration and assembly of the valve. An example of associating several levels of LUI access rights to different PIN codes may be as follows:

Level 1. Everyone should have readers access, all parameters, measurements and alarms. They are readable without entering a PIN code.

Level 2. A PIN code (that optionally can be disabled) would be required to enter typical valve assembly related parameters and to run calibration and device tests.

Level 3. Third level users would have an extended view to the device settings and more advanced parameters. Extended menu would appear when entering a specific PIN code. The extended menu would contain rarely used user parameters to make a more complicated device parameterization (examples could be control algorithm related parameters that should not be set in normal cases, or rarely used signal modification parameters).

Level 4. Fourth level could be for specialist of the vendor (e.g. Metso) to have access to all device parameters to be used in trouble shooting, problem mitigation or extreme cases, for example.

In an embodiment, a higher level of access rights may be activated automatically for a predetermined period of time upon connecting a power to the positioner 2, e.g. upon connecting the fieldbus wires or the 4-20 mA twisted pair loop 7 to the connector of the positioner 2, such the connector 27 in FIG. 3. During the predetermined period of time, such as approximately one hour, a predetermined extended access to the local user interface may be allowed without requiring PIN codes. The requirement to use normal level PIN codes to enter higher levels of access rights may be resumed after expiry of the predetermined period of time from the connection of the power is connected to the device. This would make sure that during the valve assembly it is easy to set up the right parameters in the positioner without need to all the time enter PIN codes. In normal site conditions during the operation, where parameter settings are not that frequent, the positioner would be protected from unauthorized usage by the PIN codes.

In an embodiment, if each user or user group has a unique PIN code, a log may be maintained on who has logged in the local user interface of the positioner and what actions have been done. Whenever user logs in to the local user interface, there will be an event in an event log. In an embodiment, users, access rights and PIN codes may be managed in a valve management system (such as the Metso Valve Manager, DTM), and list of users with PIN codes may be sent to each positioner 2 over the field bus 7.

The description and the related figures are only intended to illustrate the principles of the present invention by means of examples. Various alternative embodiments, variations and changes are obvious to a person skilled in the art on the basis of this description. The present invention is not intended to be limited to the examples described herein but the invention may vary within the scope and spirit of the appended claims

The invention claimed is:

1. A smart valve positioner comprising a housing and a housing cover, the housing encompassing control circuitry connectable to a field control line, and a local user interface with one or more buttons and optionally a display inside the housing under the housing cover for locally operating the valve positioner, wherein the local user interface comprises one or more non-mechanical touch buttons enclosed inside the housing, and the housing cover is configured to make the touch buttons user-operable from outside the housing by touching the housing cover, wherein each of the touch buttons are arranged to detect an electrical or optical influence of a user finger in the close proximity, and the housing cover is adapted to enable such electrical or optical influence through the housing cover to the touch button when the user finger touches a predetermined point on the housing cover, and wherein a thickness of the housing cover is reduced at said predetermined point in comparison with an overall thickness of the housing cover.

2. A smart valve positioner comprising a housing and a housing cover, the housing encompassing control circuitry connectable to a field control line, and a local user interface with one or more capacitive touch buttons and a display enclosed inside the housing under the housing cover for locally operating the valve positioner, wherein the housing cover can be opened and the same capacitive touch buttons can be operated both with the housing cover closed and open, each of the capacitive touch buttons being arranged to detect an electrical influence of a user finger in the close proximity, and the housing cover is configured to enable such electrical influence through the housing cover to the capacitive touch button when the user finger touches a predetermined point on the housing cover and thereby make the capacitive touch buttons user-operable from outside the housing by touching the housing cover, when the housing cover is closed, and wherein the capacitive touch buttons are user-operable by directly touching the capacitive touch buttons inside the housing, when the housing cover is open.

3. A smart valve positioner as claimed in claim 2, wherein a thickness of the housing cover is reduced at said predetermined point in comparison with an overall thickness of the housing cover.

4. A smart valve positioner as claimed in claim 2, wherein there is an air gap or a shock-absorbing intermediate layer between the housing cover and the local user interface.

5. A smart valve positioner as claimed in claim 2, wherein the capacitive touch buttons comprise capacitive touch buttons with a non-conductive overlay, and wherein the housing cover is made of non-conductive material, and wherein an elastic conductive element is locally arranged between the non-conducting housing cover and the non-conducting overlay at locations of said capacitive touch buttons.

6. A smart valve positioner as claimed in claim 2, wherein the user interface is configured to assume a first user access mode level as a default to thereby allow use of the capacitive touch buttons through the housing cover for a first set of user operations, and wherein the user interface is configured to require a dedicated access code for entering a further user access mode level to thereby allow use of the capacitive touch buttons through the housing cover for one or more further sets of user operations.

7. A smart valve positioner as claimed in claim 6, wherein said first set of user operations include reading operations, and said one or more further sets of user operations include reading operations and procedures for locally controlling parameters and operation of the smart valve positioner.

8. A smart valve positioner as claimed in claim 6, wherein the user interface is configured to assume the further user access mode level automatically for a predetermined period of time upon connecting a power to the valve positioner, and wherein the first user access mode level is resumed after expiry of the predetermined period of time from the connection of the power.

9. A smart valve positioner as claimed in claim 2, wherein the local user interface panel with the housing cover closed is configured to assume a first user access mode level as a default to thereby allow use of the capacitive touch buttons through the housing cover for a first set of user operations, and wherein the local user interface is responsive to an opening of the housing of the valve positioner to assume a further user access mode level to thereby allow use of the capacitive touch buttons through the closed housing cover for one or more further sets of user operations.

10. A smart valve positioner as claimed in claim 2, wherein the local user interface with the housing cover closed is configured to assume a first user access mode level as a default to thereby allow use of the capacitive touch buttons through the housing cover a first set of user operations, and wherein the local user interface with the housing cover opened is configured to assume a further access user access mode level to thereby allow use of the capacitive touch buttons directly on the local user interface for one or more further sets of user operations.

11. A smart valve positioner as claimed in claim 2, wherein the local user interface is provided with electrical, optical or mechanical detector detecting whether the housing or the housing cover is opened or closed.

12. A smart valve positioner as claimed in claim 11, wherein the housing cover comprises at least one magnetic element, and wherein the local user interface panel is provided with a magnetic sensor or a Hall sensor configured to detect the presence of the magnetic element.

13. A valve assembly comprising
a valve;
an actuator; and
a smart valve positioner; the smart valve positioner further comprising a housing and a housing cover, the housing encompassing control circuitry connectable to a field control line, and a local user interface with one or more buttons and a display inside the housing under the housing cover for locally operating the valve positioner, wherein the local user interface comprises one or more touch buttons enclosed inside the housing, and the housing cover is configured to make the touch buttons user-operable from outside the housing by touching the housing cover, and wherein the local user interface is provided with electrical, optical or mechanical detector detecting whether the housing or the housing cover is opened or closed.

* * * * *